United States Patent
Narimatsu

(10) Patent No.: US 12,084,785 B2
(45) Date of Patent: Sep. 10, 2024

(54) METHOD AND APPARATUS FOR PULLING SINGLE CRYSTAL

(71) Applicant: GLOBALWAFERS JAPAN CO., LTD., Niigata (JP)

(72) Inventor: Shingo Narimatsu, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 164 days.

(21) Appl. No.: 17/771,880

(22) PCT Filed: Oct. 20, 2020

(86) PCT No.: PCT/JP2020/039410
§ 371 (c)(1),
(2) Date: Apr. 26, 2022

(87) PCT Pub. No.: WO2021/090676
PCT Pub. Date: May 14, 2021

(65) Prior Publication Data
US 2022/0364258 A1    Nov. 17, 2022

(30) Foreign Application Priority Data
Nov. 6, 2019 (JP) .................................. 2019-201792

(51) Int. Cl.
C30B 15/04 (2006.01)
C30B 15/10 (2006.01)
C30B 29/06 (2006.01)

(52) U.S. Cl.
CPC .............. C30B 15/04 (2013.01); C30B 15/10 (2013.01); C30B 29/06 (2013.01)

(58) Field of Classification Search
CPC .......... C30B 15/04; C30B 15/10; C30B 29/06
See application file for complete search history.

(56) References Cited

U.S. PATENT DOCUMENTS

| | | | |
|---|---|---|---|
| 2009/0120352 A1* | 5/2009 | Kubota | C30B 29/06 117/217 |
| 2011/0195251 A1 | 8/2011 | Gmeilbauer et al. | |

(Continued)

FOREIGN PATENT DOCUMENTS

| | | |
|---|---|---|
| JP | 2009215117 A | 9/2009 |
| JP | 2010-163305 A | 7/2010 |

(Continued)

OTHER PUBLICATIONS

Machine translation of JP2010-163306 (Year: 2024).*

(Continued)

Primary Examiner — Matthew J Song
(74) Attorney, Agent, or Firm — BUCHANAN, INGERSOLL & ROONEY PC

(57) ABSTRACT

A method and an apparatus of pulling single crystals are provided that allows adding dopants efficiently into the silicon melt without causing to generate dislocations and obtainment of single crystals with low resistivity, during forming the former half of a product portion after the formation of the shoulder, when pulled up from the silicon melt by the Czochralski method. The method includes steps of forming an inert gas flow G that flows from above toward the silicon melt M1 along the inside of a heat shield 7 disposed to surround the silicon crystal C to be grown in the furnace and expands in radial directions along the surface of the silicon melt and is exhausted to the outside of the furnace, gasifying a dopant in the furnace, discharging the gasified dopant into the inside of the heat shield, and flowing the gasified dopant carried by the inert gas flow.

3 Claims, 6 Drawing Sheets

(56) References Cited

U.S. PATENT DOCUMENTS

2014/0174591 A1\* 6/2014 Hilker .................... C30B 15/04
                                                              141/2
2020/0048789 A1\* 2/2020 Soeta ..................... C30B 29/06

FOREIGN PATENT DOCUMENTS

| | | | |
|---|---|---|---|
| JP | 2010-163322 A | 7/2010 | |
| JP | 2010143776 A | 7/2010 | |
| JP | 2010163306 A \* | 7/2010 | ............ C30B 15/04 |
| JP | 2011-132043 A | 7/2011 | |
| JP | 2011162436 A | 8/2011 | |
| JP | 2016501824 A | 1/2016 | |
| JP | 2018070428 A | 5/2018 | |
| JP | 2018177593 A | 11/2018 | |

OTHER PUBLICATIONS

Office Action (The First Office Action) issued Apr. 14, 2023, by the National Intellectual Property Administration, P. R. China in corresponding Chinese Patent Application No. 202080077251.3. (6 pages).

\* cited by examiner

METHOD AND APPARATUS FOR PULLING SINGLE CRYSTAL

TECHNICAL FIELD

The present invention relates to a method of pulling up silicon crystals by the Czochralski method (CZ method) and an apparatus for pulling up the same, particularly to a method and an apparatus to obtain a single crystal for manufacturing n-type semiconductors having low resistivity by heavily doping such as red phosphorus or arsenic.

BACKGROUND ART

Regarding silicon single crystal growth by the CZ method, raw material polysilicon is fed into a quartz crucible 51 installed in a chamber 50 shown in FIG. 7 and is heated to form a silicon melt M with a heater 52 provided around the quartz crucible 51.

After that, a seed crystal P fixed to the seed chuck is dipped into the silicon melt M, and silicon single crystal is grown by pulling up the seed chuck while the seed chuck and quartz crucible 51 are rotated in the same or opposite direction.

After the temperature of the silicon melt M becomes stable, before starting pulling up a crystal, necking is performed where the seed crystal P is brought into contact with the silicon melt M to dissolve the tip portion of the seed crystal P. The necking is an indispensable process to eliminate dislocations in the silicon crystal introduced by a thermal shock generated when the seed crystal P is in contact with the silicon melt M.

The necking process forms the neck portion P1. The neck portion P1 typically has a diameter of 3 mm to 4 mm and needs to have a length of at least 30 mm or longer or, in some cases, 100 mm to 500 mm.

Regarding steps after the pulling-up step is getting started, after the necking step, a formation step of a shoulder C1 by which the diameter is expanded to that of a straight portion, a formation step of the straight portion C2 where a single crystal is grown as a product, and a formation step of a tail (not shown) in which the diameter of the single crystal is gradually reduced after the formation of the straight portion are performed.

For the production of n-type semiconductors for low-breakdown-voltage power devices, single crystals C having low resistivity heavily doped with dopants such as red phosphorus or arsenic are demanded. As methods to add highly-sublimable dopants such as red phosphorus or arsenic to the Melt, before dipping the seed crystal P in the melt M, a method in which dopants in solids are added to the silicon melt M as it is, or a method of blowing a gas-phase dopant to the surface of the silicon melt M is widely known.

Unfortunately, with the conventional methods, because dopants are added to the silicon melt M at a high concentration before the formation of the shoulder, the dislocations may not be eliminated during the necking process.

Even if the dislocations are successfully eliminated during the necking process, in the formation step of the shoulder thereafter, there arises a problem that the crystal habit line is apt to disappear and dislocation in the crystal occurs before reaching the product portion, the straight body.

As is a possible method to solve the problem, there is a method in which a dopant may be added to the silicon melt during the formation of the former half part of the product portion (straight body), after the formation of the shoulder C1.

When a solid dopant is fed to the silicon melt after the formation of the shoulder C1, another problem arises that the crystal habit line disappears when the solid dopant is in contact with the crystal.

To solve such problems, Patent Literature 1 (PTL1) discloses that a doping tube 60 for supplying a solid dopant penetrates the furnace as shown in FIG. 8, the solid dopant is sublimated in the doping tube by the heat of the furnace, and the sublimated dopant is blown to the liquid surface M1 of the silicon melt M through the supply tube 61.

CITATION LIST

Patent Literature

PTL1: JP-A-2009-215117

SUMMARY OF INVENTION

Technical Problem

With this method, after the formation of the shoulder C1, by adding the dopant to the silicon melt M at the timing during the formation of the former half portion of the straight body C2, the concentration of the dopant in the silicon melt M can be a predetermined value based on the supplied amount of the dopant.

In the method disclosed in PTL1, however, a problem arises that the growth of a single crystal becomes difficult because the crystal is apt to dislocate due to the vibration of the liquid surface M1 caused by the local blowing of gasified dopant to the liquid surface M1 of the silicon melt M.

Another problem is that the amount of the dopant reaching the surface M1 of the melt decreases when the distance between the tip end of the supply tube 61 and the surface of the melt M is made large in order to suppress the vibration of the liquid surface M1 of the melt M.

It is also problematic that the intake rate of the dopant to the silicon melt M is low due to the localization of the blown area by the supply tube 61. In particular, because the blow port 61a of the supply tube 61 is disposed outside the heat shield 58, the area is small where the dopant gas from the blow port 61a is brought into contact with the silicon melt M, and the dopant gas is not taken in the melt M effectively. As a result, the ratio of the dopant dissolved into the melt M decreases, and the necessary dopant amount to be added increases in order to cause the dopant concentration to reach the predetermined value; this causes the cost to rise in the end.

The present invention is made in view of the above problems and aims to provide a method and an apparatus for pulling single crystals with and by which the single crystals having low resistivity are pulled up by adding a dopant effectively to the silicon melt without causing dislocations to occur during the formation of the former half of the product portion, when silicon single crystals are pulled up from the silicon melt by the Czochralski method after forming the shoulder.

Solution to Problems

In the step of flowing the gasified dopant on the inert gas flow, when the dopant is arsenic, the concentration of the dopant in the silicon melt is desirably at least 1.5E20 atoms/cm$^3$ or more. In another case, when the dopant is red phosphorus in the step of flowing the gasified dopant (hereinafter referred as dopant gas) on the inert gas flow, the concentration of the dopant in the silicon melt is desirably at least 1.9E20 atoms/cm³ or more.

As seen in this invention, it is constructed that the dopant gas formed in the furnace is carried on the inert gas flow in contact with the whole area of the surface of the silicon melt. Accordingly, the dopant is taken into the silicon melt from the whole surface of the silicon melt, and the intake rate increases. Because the dopant gas that hits the liquid surface of the silicon melt but is not taken into the melt is exhausted to outside with the inert gas, the liquid surface of the silicon melt does not vibrate, and generation of dislocations is suppressed.

As a result, single crystals highly doped with red phosphorus or arsenic, for example, having low resistivity can be obtained.

The single crystal pulling apparatus according to the present invention in which silicon single crystals are grown by the Czochralski method with a silicon melt in a crucible disposed in a furnace heated with a heater includes a heat shield disposed at the above of the crucible so as to surround the growing silicon single crystal, a sublimation chamber having a torus shape provided with a plurality of blowing ports along the circumferential direction on the inner surface of the heat shield, and a funnel portion for supplying a dopant to the sublimation chamber whose distal end communicates with the sublimation chamber.

The funnel portion has a funnel having an inverted cone shape, and a funnel pipe extending from the reduced tip end of the funnel to the sublimation chamber. It is desirable that the diameter of the upper opening of the funnel is 40 mm to 80 mm, the diameter of the funnel pipe is 4 mm to 10 mm, the inner diameter of the sublimation tube is 20 mm to 50 mm, and the inner diameter of the sublimation chamber having a torus shape is in a range of 120% to 150% of the diameter of the silicon single crystal to be grown.

Further, it is desirable that the blowing ports in the sublimation chamber have a diameter of 5 mm to 15 mm, and the ports are disposed with a predetermined interval along the circumferential direction of the sublimation chamber whose number is in a range of 10 to 30.

With such a structure formed in the furnace, dopant gas is carried by the inert gas that is in contact with the whole surface of the silicon melt. This allows the dopant to be taken into the silicon melt from the whole surface of the melt, and the intake ratio can be increased. The dopant gas that hit the melt surface but is not taken in is exhausted from the furnace with the inert gas, and as a result the surface of the melt does not vibrate and the occurrence of dislocations is prevented.

As a result, single crystals highly doped with red phosphorus or arsenic, for example, having low resistivity can be obtained.

Advantageous Effects of Invention

The present invention allows providing a method and an apparatus for pulling single crystals with and by which the single crystals having low resistivity are pulled up by adding a dopant effectively to the silicon melt without causing dislocations to occur during the formation of the former half of the product portion when silicon single crystals are pulled up from the silicon melt by the Czochralski method after forming the shoulder.

DESCRIPTION OF EMBODIMENTS

A single crystal pulling-up method and apparatus according to the present invention will be described with reference to the drawings. The method is to obtain an n-type silicon single crystal having low resistivity by adding a dopant to a silicon melt at a high concentration after forming a shoulder of a single crystal.

Figure 1:
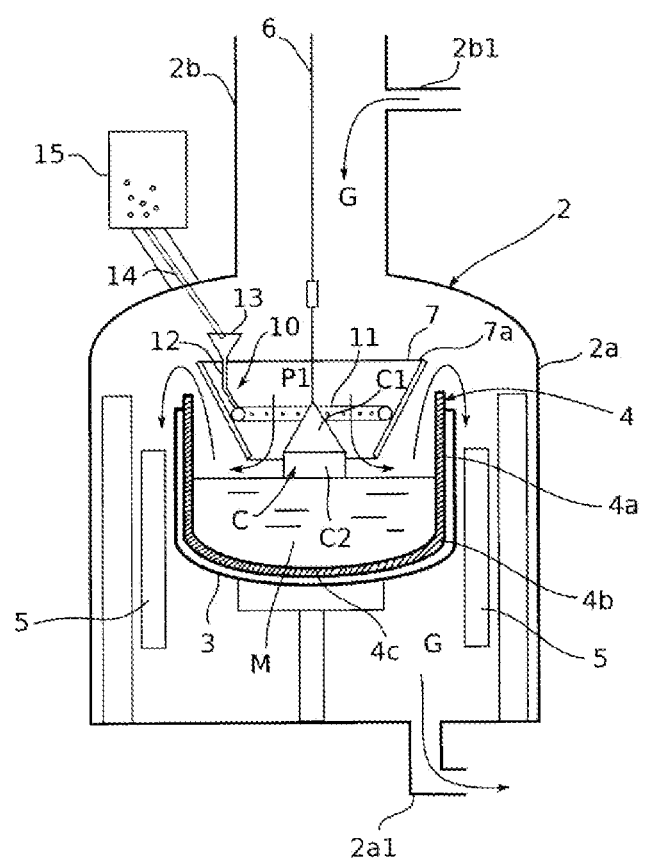
FIG. 1 is a cross-sectional view of a single crystal pulling-up apparatus in which the present invention is to be implemented.
Figure 2:
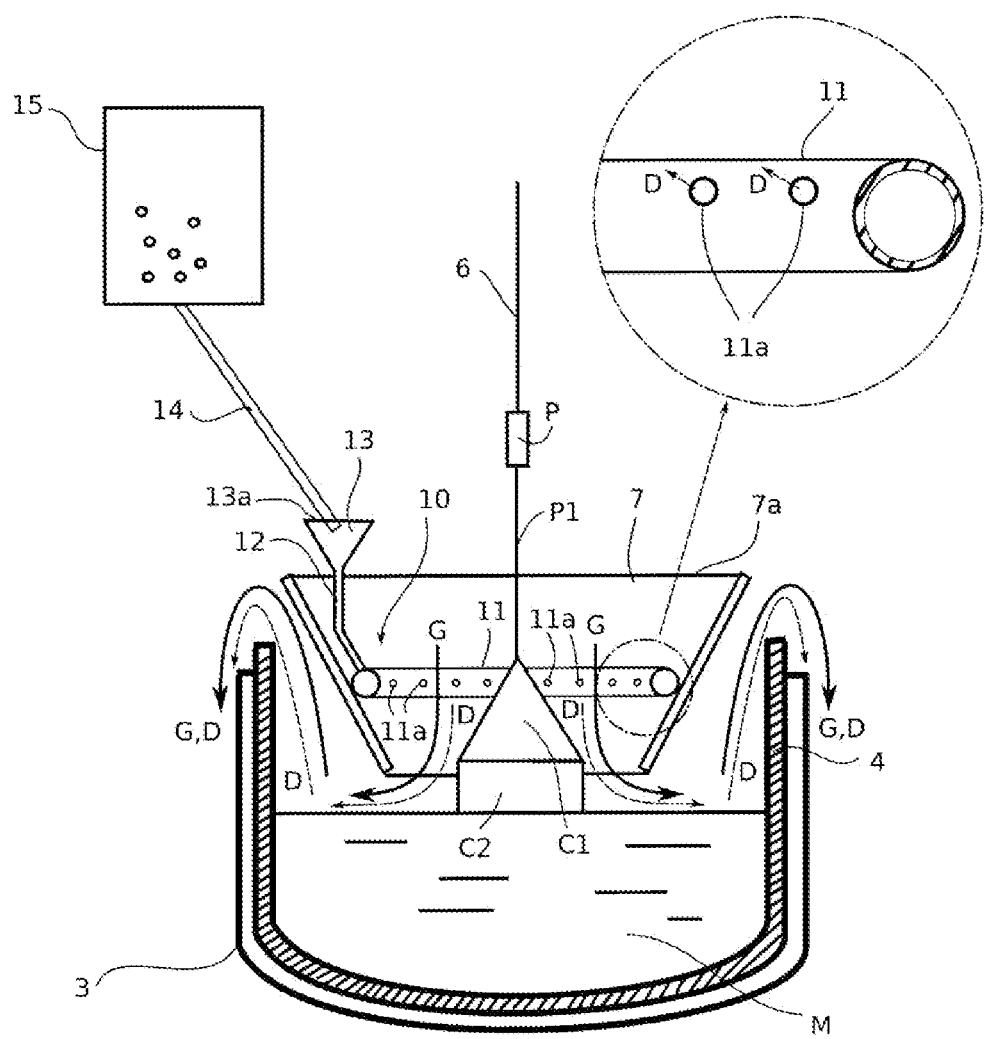
FIG. 2 is a cross-sectional view of an enlarged principal portion of the single crystal pulling-up apparatus shown in FIG. 1.

FIG. 1 is a cross-sectional view of a single crystal pulling-up apparatus in which the present invention is to be implemented. FIG. 2 is a cross-sectional view of an enlarged principal portion of the single crystal pulling-up apparatus shown in FIG. 1.

The single crystal pulling-up apparatus 1 is provided with, in a furnace 2, a carbon susceptor (or graphite susceptor) 3 that is rotatable around the vertical axis and elevatable and a quartz glass crucible 4 (hereinafter simply referred to as crucible 4) housed in the carbon susceptor 3.

The crucible 4 has a straight body 4a and a bottom portion formed thereunder, that is, in a range including a small-diameter portion 4b and a large-diameter portion 4c, and is rotatable around the vertical axis with the rotation of the carbon susceptor 3.

There is provided below the susceptor with a rotation means (not shown) such as a motor to rotate the susceptor 3 around the vertical axis and a susceptor elevation means (not shown) to elevate the carbon susceptor 3.

The single crystal pulling-up apparatus 1 is provided with a side heater 5 with which semiconductor raw material, polysilicon, charged in the crucible 4 is resistive-heated to melt to a silicon melt M (hereinafter simply referred to as melt M) and a pulling-up mechanism (not shown) to pull up the grown single crystal C by winding a wire 6. A seed crystal P is attached to the distal end of a wire 6 of the pulling-up mechanism.

Up above the melt M formed in crucible 4, a radiation shield, a heat shielding plate, having a cylindrical shape with both upper and lower end open is provided for shielding unnecessary radiation heat from the side heater 5 and the melt M to the growing single crystal C.

The gap between the lower end of the radiation shield 7 and the liquid surface of the melt M is adjusted so as to maintain a predetermined distance depending on the desired characteristics of the crystals to be grown.

The furnace 2 is composed of a main chamber 2a to house the crucible 4 and others and a pull-up chamber 2b for pulling up single crystals C extending from the top of the main chamber 2a to the above. A gas supply tube 2b1 to introduce an inert gas G into the furnace is provided on the circumferential surface of the pull-up chamber 2b and gas exhausting pipe 2a1 to discharge the inert gas introduced into the furnace 2 to the outside the furnace 2 is provided on the bottom of the main chamber 2a.

With this structure, after flowing down from the upper opening 7a along the inside of the radiation shield 7, hitting the liquid surface of the silicon melt M, flowing upward along the outside surface of the radiation shield 7, and flowing to the outside of the crucible 4, the inert gas G introduced into the furnace 2 is discharged through the gas exhaust pipe 2a1 to the outside of the furnace, as indicated with the arrow in FIG. 1.

A sublimation unit 10 is provided inside the radiation shield 7 for subliming a solid dopant to dopant gas D and releasing the dopant gas D into the furnace 2. The sublimation unit 10 is made of silica glass and composed of a sublimation unit (a sublimation chamber) 10 for subliming a solid dopant to dopant gas D, a funnel tube 12 (funnel portion) for supplying the solid dopant to the sublimation chamber 11, and a funnel 13 (funnel portion).

The sublimation chamber 11 extends annularly in the circumferential direction along the inner peripheral surface of the radiation shield 7, and is formed as a tubular body having a circular cross section.

The funnel tube 12 is straight tube-shaped, and the lower end thereof is communicably connected to the sublimation chamber 11 in furnace 2. The upper end of the funnel tube 12 is communicably connected to the lower end of the funnel 13 formed as an inverted cone.

Specifically, when a solid dopant is charged to the funnel 13, the dopant is fed to the sublimation chamber 11 being a tubular body through the funnel tube 12. The fed solid dopant into the sublimation chamber is sublimed by heat from furnace 2 heated to a high temperature to dopant gas. The dopant gas formed in the sublimation chamber blows out from the blowing port 11a to be described later into the furnace 2.

Figure 3:
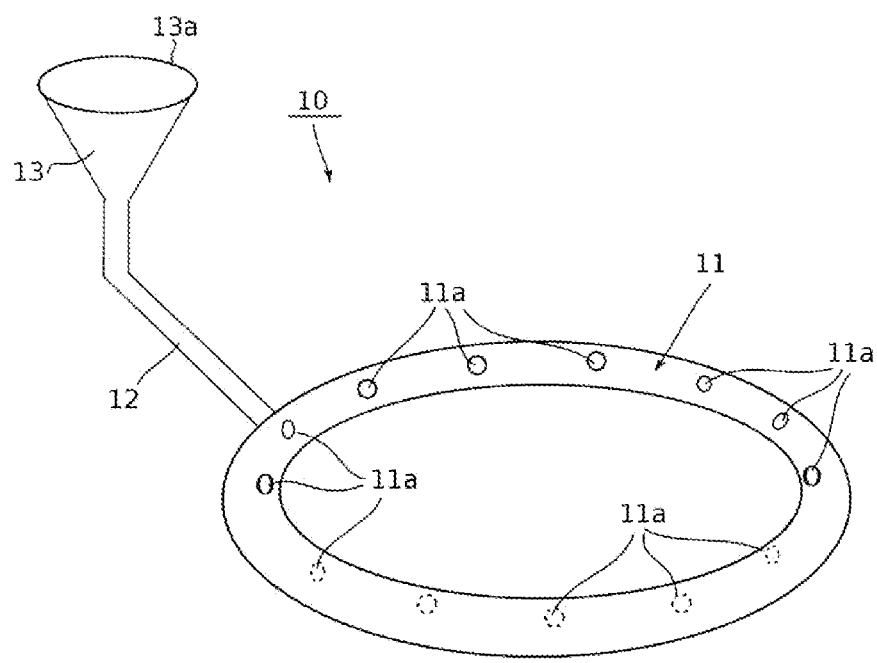
FIG. 3 is a perspective view of the enlarged sublimation unit.
Figure 4:
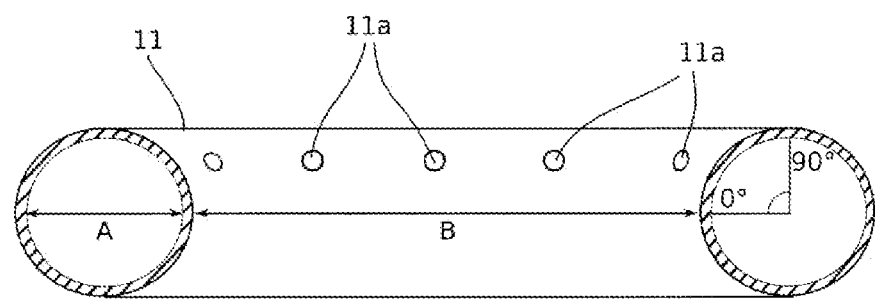
FIG. 4 is a cross-sectional view of a sublimation chamber of the sublimation unit.

FIG. 3 is a perspective view of the enlarged sublimation unit 10. FIG. 4 is a cross-sectional view of a sublimation chamber 11 of the sublimation unit 10. The sublimation chamber 11 is an annular tubular body with a circular cross-section and is disposed in parallel to the liquid surface of the melt M, that is, horizontal. As shown in FIG. 3, a plurality of blowing ports 11a, the number of which is 10 to 30, for example, is disposed for blowing the sublimated dopant toward the center, for example, of the annular body, in the sublimation chamber 11.

As shown in FIG. 3, the plurality of blowing ports 11a is formed at equal intervals, for example, on the inner side surface of the annular sublimation chamber 11 along the circumferential direction. Specifically, as shown in FIG. 4, when let the angle of the horizontal direction toward the single crystal pulling-up axis 0 degrees and that of the vertically upward direction 90 degrees, the blowing ports 11a are desirably disposed at an angle between 0 degrees and 90 degrees, 45 degrees, for example. This is because the dopant gas blown from the blowing port 11a can be carried by the flow of the inert gas immediately.

Further, as shown in FIG. 4, the inner diameter A of the sublimation chamber 11 is formed in a range from 20 mm to 50 mm to prevent the sublimated dopant from flowing reversely to the funnel tube and to prevent the dopant gas from being stagnated in the tube.

The inner diameter B of the annular tube of the sublimation chamber 11 is desirably set between 120% or more and 150% or less of the diameter of the single crystal C to be grown. It is because when the inner diameter B is 120% or smaller, the single crystal C being grown may come in contact with the sublimation chamber 11, and when the inner diameter B is 150% or larger, the amount of the blown dopant gas from the blowing port 11a may not be uniform between the blowing ports 11a; that is, the blowing port 11a closer to the funnel tube 12 blows more amount of the gas.

Further, the diameter of the blowing port 11a is desirably formed in a range of 5 mm to 15 mm. It is because when the diameter of the bowing port 11a is smaller than 5 mm, the sublimated dopant gas sublimated in the sublimation chamber may flow reversely to the funnel tube 12, and when the diameter is larger than 15 mm, the not-sublimated dopant may fall from the blowing port 11a.

Further, the diameter of the upper opening 13a of the funnel 13 is desirably formed 40 mm to 80 mm. It is because when the diameter of the upper opening 13a is smaller than 40 mm, the dopant released from a dopant supply tube 14 may overflow from the funnel 13 to the outside. Meanwhile, the weight of funnel 13 becomes heavy and the load on funnel tube 12 increases too much when the diameter of the upper opening 13a is larger than 80 mm.

Further, the inner diameter of the funnel tube 12 is desirably formed from 4 mm to 10 mm. It is because when the inner diameter is smaller than 4 mm, the dopant to be passed may be blocked midway, and when the diameter is larger than 10 mm, the sublimated dopant gas sublimated in the sublimation chamber may flow reversely to the funnel tube 12.

The lower end of the dopant supply tube 14 made of silica glass is inserted to the upper opening 13a of the funnel 13, and the dopant supply tube 14 is disposed to penetrate the main chamber 2a outside. The upper end of the dopant supply tube is disposed outside of the furnace 2 and communicably connected to a dopant chamber 15 housing solid dopants, such as red phosphorus or arsenic. The average diameter of the solid dopants is 2.0 mm.

With thus configured single crystal pulling-up apparatus, a single crystal C with a diameter of 206 mm, corresponding to a product with a diameter of 200 mm, with a length of a straight body of 1600 mm is to be pulled up as follows: First, raw material polysilicon is charged in the crucible 3, and then the crystal growing process is started based on the program stored in a storage means installed in a computer (not shown).

An inert gas G, mainly argon gas, is introduced to the furnace 2 through the gas supply tube 2b1 disposed on the upper portion of the furnace 2, as shown in FIG. 1. The inert gas G passes from the upper side to the lower side inside the radiation shield 7, hits the raw material polysilicon, the silicon melt M after melting, charged in the crucible 4. Further, the inert gas flows from the lower side to the upper side between the outer surface of the radiation shield 7 and the inner periphery of the crucible, flows outside the crucible from the lower side to the upper side, and is exhausted to the outside of the furnace through the gas exhaust pipe 2a1.

With this, an atmosphere of the inert gas G is formed in the furnace 2, and a flow of the inert gas from the upper side to lower side as a whole is formed.

The raw material polysilicon charged in the crucible 4 is melted by heating with the side heater 5, resulting in a silicon melt M. The inert gas G flowing to the silicon liquid surface M1 along the inner surface of the radiation shield 7 from the upper side spreads radially along the silicon liquid surface and is exhausted to the outside of the crucible 4. The crucible 4 is rotated at a predetermined rotation speed (in rpm) at a predetermined position in height. Then, the wire 6 is lowered to have the seed crystal P be in contact with the silicon melt M and the necking in which the tip end of the seed crystal P is melted is performed to start the formation of the neck P1.

After the neck P1 is formed, the pulling conditions are adjusted with the parameters such as the power supplied to the side heater 5 and the pulling speed (usually, a speed of several millimeters per minute), and the seed crystal P starts rotating at a predetermined rotation speed in the direction opposite to the rotation direction of the crucible 4. Then, the diameter of the crystal is expanded to form a shoulder C1 and the process moves to the one for forming the straight body C2 to be a product.

After the shoulder C1 of a silicon single crystal is formed, in the former half stage of forming the straight body C2, a solid dopant, red phosphorus or arsenic, for example, is supplied to the funnel 13 from the dopant chamber through the dopant supply tube 14. The solid dopant supplied to the funnel 13 is supplied to the sublimation chamber 11 disposed inside of the radiation shield 7 through the funnel tube 12. The solid dopant supplied to the sublimation chamber 11 sublimes due to the heat inside the furnace to become a dopant gas D and is released from the plurality of the blowing ports 11a.

The concentration of dopant of the silicon melt M, the concentration of the single crystal C, and further the resistivity of the single crystal C can be made to a desired values, by grasping the relational expression in advance between the supplied amount of the solid dopant to the sublimation chamber 11 and the concentration of the dopant of the silicon melt M.

With the method according to the present invention, in the case where the dopant is red phosphorus, the concentration of the dopant in the silicon melt M is desirably to be about 1.9E20 atoms/cm$^3$ and this allows the resistivity of the single crystal to be about 1.1 mSΩcm. Further, in the case where the dopant is arsenic, the concentration of the dopant in the silicon melt M is desirably to be about 1.5E20 atoms/cm$^3$ and this allows the resistivity of the single crystal to be about 1.8 mSΩcm.

The dopant gas D discharged from the blowing ports 11a flows to the lower side carried by the inert gas G flowing from the upper to the lower side inside the radiation shield 7 and comes into contact with the liquid surface of the silicon melt M. With this, the dopant gas D is effectively absorbed into the silicon melt M and the concentration of dopant in the silicon melt M increases. As a result, the dopant concentration of the straight body of the single crystal grown from the silicon melt M is high, and a crystal having low resistivity is formed.

As described above, the dopant gas D carried by the flow of the inert gas G is taken and absorbed into the silicon melt M, but the dopant gas D not absorbed is exhausted to the outside of the furnace with the inert gas G. Accordingly, since the blowing of the dopant gas D to the silicon melt M is achieved by the flow of the inert gas G formed inside the furnace 2, the liquid surface of the silicon melt M does not vibrate, and the generation of dislocations is prevented.

Because the dopant gas D comes into contact with the whole area of the liquid surface of the silicon melt M with the flow of the inert gas G, the dopant is effectively taken into the silicon melt M. As a result, this causes the intake rate of the dopant to increase.

With the progress of the pulling-up of the silicon single crystal and formation of the straight body C2, the carbon susceptor 3 housing crucible 4 moves upward and keeps the position of liquid surface M1 relative to the position of the radiation shield 7 and the side heater 45 which are positionally fixed. When the step of the straight body formation is finished, a diameter reduction step is performed in which the diameter of the single crystal is reduced to form the bottom portion (not shown). This completes the pulling up of crystal C.

As stated above, in the present invention, the dopant gas formed inside furnace 2 is carried by the inert gas flow that is in contact with the whole area of the surface of the silicon melt. The dopant is taken into the silicon melt from the whole surface thereof, and thereby the intake rate increases. Because the dopant gas D that hits the liquid surface of the silicon melt but is not taken into the melt is exhausted outside the furnace 2 with the inert gas G, the liquid surface of the silicon melt does not vibrate, and the generation of dislocations can be prevented.

As a result, single crystals highly doped with red phosphorus or arsenic, for example, having low resistivity can be obtained.

It is to be noted that the plurality of the blowing ports 11a is arranged desirably at an angle in a range of 0 degrees to 90 degrees indicated in FIG. 4, but the arrangement is not restricted to this.

Figure 5A:
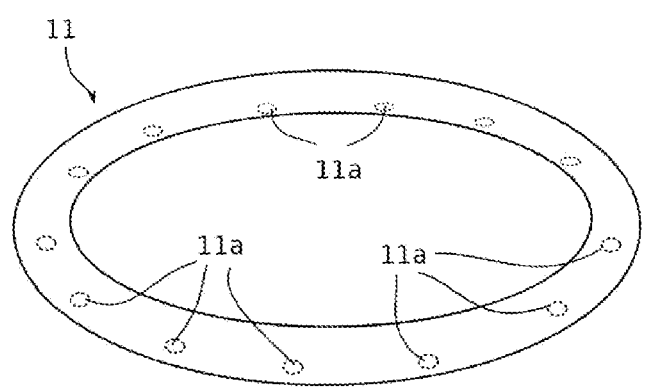
FIGS. 5A and 5B are cross-sectional views of modified examples of the sublimation chamber.
Figure 5B:
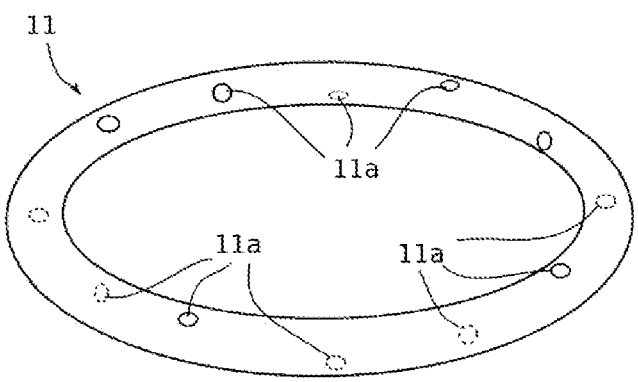

The blowing ports 11a may be disposed on the lower surface of the sublimation chamber 11 (at 270 degrees), for example, as shown in FIG. 5A, or they may be disposed in a staggered arrangement on the upper, lower, or side surface as shown in FIG. 5B The cross-sectional shape of the tube of the sublimation chamber 11 in the above embodiment is circular, but it is not restricted to this and may be any one of trapezoidal, rectangular, or triangular shapes.

EXAMPLES

The method of single-crystal pulling-up and the apparatus thereof will be described based on examples.

Example 1

In example 1, with the single crystal pulling-up apparatus with a structure described in the embodiment above, the polysilicon raw material of 150 kg was charged into the crucible, and a silicon single crystal with a diameter of 206 mm was pulled up.

As a dopant, red phosphorus was selected and doped in the former half of the growth of the straight body using the sublimation unit 10 described in the above embodiment.

In the sublimation unit 10, the diameter of the upper opening 13a of the funnel 13 is 80 mm, the diameter of the funnel tube 12 is 6 mm the inner diameter A of the sublimation chamber is 40 mm, and the inner diameter of the annular tube B of the sublimation chamber 11 is 240 mm. Further, the blowing ports 11a formed on the sublimation chamber 11 are disposed with an equal interval at ten positions. The diameter of the blowing ports 11a is 8 mm. The arrangement angle of the blowing ports is 45 degrees following the definition of the angle in FIG. 4.

The dopant was charged into the sublimation chamber 11 in plural times until reaching 1000 g, 5 to 10 times at a time, after the formation of the shoulder. It was confirmed visually at every time of feeding that the solid-phase dopant has sublimed, and then the next feeding was performed.

Three (3) single crystals were grown with the above condition. The evaluation items are the occurrence of the vibration of the silicon melt surface, generation of dislocations during the growth of the crystals, and the efficiency of dopant, where the efficiency of the dopant is defined by the results of measurement of the resistivity at the vertically cut surface of the straight body and indicates the degree of contribution of the gasified dopant to the resistivity.

Comparative Example 1

The sublimation unit used in Example 1 is not employed in the comparative Example 1. A gasified dopant is blown locally to the liquid surface of the silicon melt outside of the radiation shield. Other conditions are the same as Example 1.

Results

In Example 1, single crystals were pulled up with feeding predetermined amounts of a dopant, and the resistivity of each thereof was measured with the four-probe method. The results show the resistivity is 1.1 mSΩcm or lower in any case of three pulled-up crystals.

In contrast, in Comparative Example 1, single crystals were pulled up with feeding predetermined amounts of a dopant, and the resistivity of each thereof was measured with the four-probe method. The results show the resistivity is 2.0 mΩcm or higher in any case of three pulled-up crystals.

The results of Example 1 and Comparative Example 1 are shown in Table I on the occurrence of vibration of the liquid surface of the silicon melt and the generation of dislocations during the crystal growth process.

TABLE I

| | | Vibration of melt surface | Dislocation generation during doping |
|---|---|---|---|
| Example 1 | 1st pulling | Not occurred | Not generated |
| | 2nd pulling | Not occurred | Not generated |
| | 3rd pulling | Not occurred | Not generated |
| Comparative Example 1 | 1st pulling | Occurred | Generated |
| | 2nd pulling | Occurred | Not generated |
| | 3rd pulling | Occurred | Generated |

As shown in Table I, in Example 1, neither surface vibration occurs nor dislocation in the crystal is generated. On the other hand, in Comparative Example 1, surface vibration of the melt occurs every time, and crystal dislocation believed to be due to the surface vibration is generated twice among three times of pulling.

Figure 6:
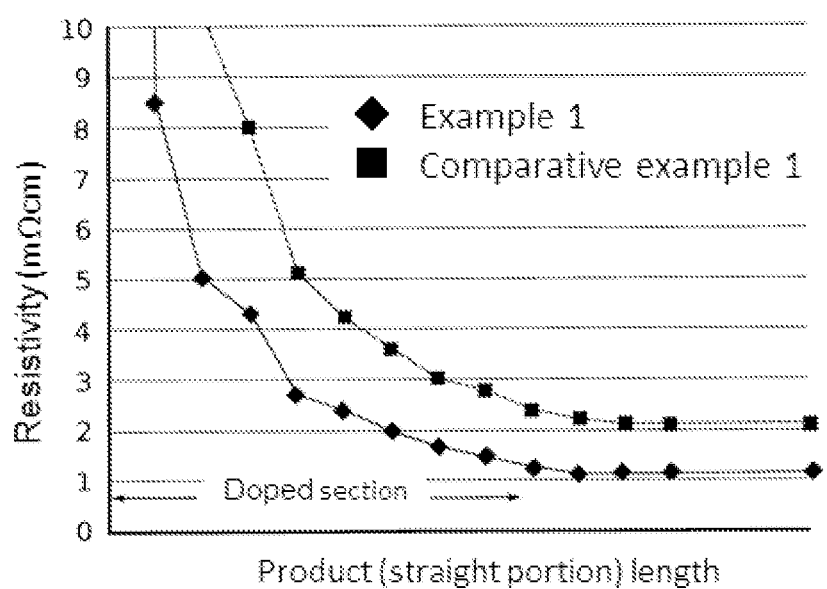
FIG. 6 is a graph illustrating the results of examples.
Figure 7:
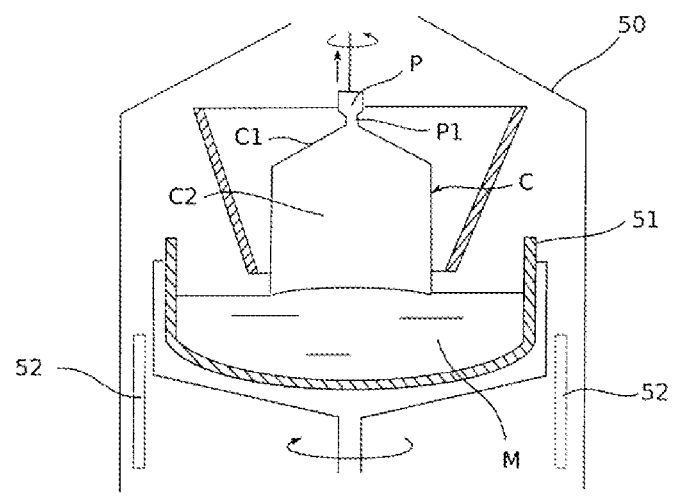
FIG. 7 is a cross-sectional view for the description of the process of pulling up silicon single crystals by the Czochralski method.
Figure 8:
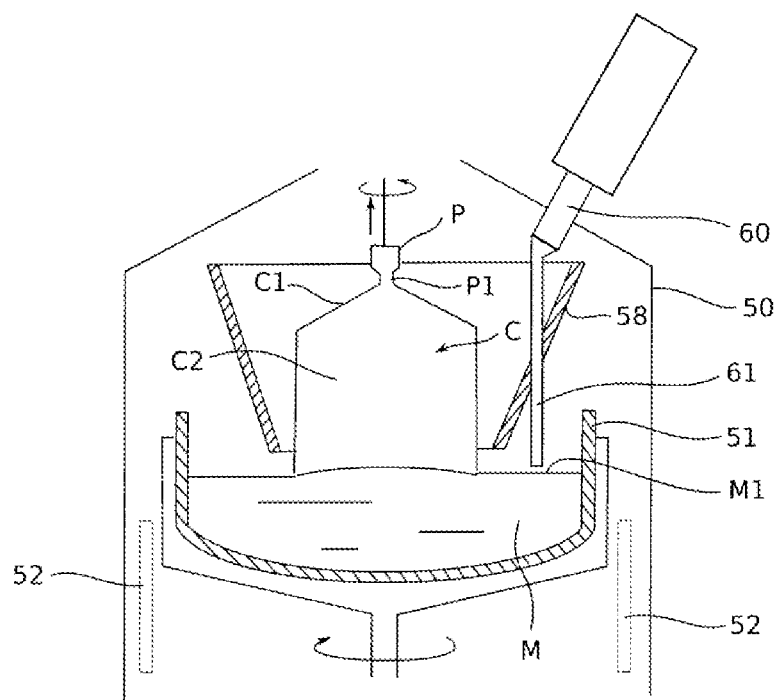
FIG. 8 is a cross-sectional view of an outline block diagram of a conventional single crystal pulling-up apparatus.

FIG. 6 is a graph of the resistivity measured at the vertically cut surface of the straight body, which is to be the product, showing the result of the effects due to dopant addition, where the horizontal axis is the lengthwise position of the straight body (product portion) and the vertical axis is the resistivity (mΩcm).

As shown in FIG. 6, it is confirmed that crystals having lower resistivity are obtained in Example 1 compared to in Comparative Example 1 and that the ratio of the absorbed dopant into the silicon melt is as much as approximately twice that of Comparative Example 1.

As seen from the results of Example 1, according to the present invention, it is confirmed that a highly sublimable dopant can effectively be added into the silicon melt without causing to generate dislocations and that single crystals having low resistivity are obtainable.

LIST OF REFERENCE SIGNS 1 single crystal pulling-up apparatus
2 furnace
3 susceptor
4 crucible
5 side heater
6 wire
7 radiation shield (thermal insulating plate)
10 sublimation unit
11 sublimation chamber
11a blowing port
12 funnel tube (funnel portion)
13 funnel (funnel portion)
14 dopant supply tube
15 dopant chamber
M silicon melt
C silicon single cystal
C1 shoulder
C2 straight body
G inert gas
D dopant gas

The invention claimed is:

1. An apparatus for pulling up single crystals where a silicon melt is formed in a crucible disposed in a furnace heated with a heater and the silicon single crystals are grown by the Czochralski method, comprising:
a gas supply tube provided on an upper portion of the crucible to introduce an inert gas into the furnace;
a gas exhaust pipe provided on a lower portion of the crucible to exhaust the inert gas outside the furnace;
a heat shield disposed above the crucible to surround the silicon single crystal to be grown to flow the inert gas introduced through the gas supply tube toward a surface of the silicon melt therein;
a sublimation chamber having a torus shape provided with a plurality of blowing ports along the circumferential direction on an inner surface of the heat shield, sublimating a solid dopant by the heat inside the furnace, and discharging through the plurality of blowing ports as a dopant gas; and
a funnel for supplying the solid dopant to the sublimation chamber whose distal end communicates with the sublimation chamber,
wherein the inert gas flowing toward the silicon melt surface along the inner surface of the heat shield spreads radially along the silicon melt surface and is exhausted to the outside of the furnace from the gas exhaust pipe, and the dopant gas discharged through the plurality of blowing ports comes into contact with the silicon melt surface on the inert gas.

2. The apparatus for pulling up single crystals according to claim 1, wherein the funnel portion is provided with a funnel having an inverted cone shape and a funnel pipe extending from the reduced tip end of the funnel to the sublimation chamber, and wherein the diameter of the upper opening of the funnel is 40 mm to 80 mm, the diameter of the funnel pipe is 4 mm to 10 mm, the inner diameter of the sublimation chamber is 20 mm to 50 mm, and the inner diameter of the sublimation chamber having a torus shape is in a range of 120% to 150% of the diameter of the silicon single crystal to be grown.

3. The apparatus for pulling up single crystals according to claim 2, wherein the blowing ports in the sublimation chamber have a diameter of 5 mm to 15 mm, and the ports are disposed with a predetermined interval along the circumferential direction of the sublimation chamber with the number thereof in a range of 10 to 30.

* * * * *